US 8,205,107 B2

(12) United States Patent
Berke et al.

(10) Patent No.: US 8,205,107 B2
(45) Date of Patent: Jun. 19, 2012

(54) SYSTEM AND METHOD FOR USING AN ON-DIMM REMOTE SENSE FOR CREATING PERFORMANCE AND POWER OPTIMIZATION

(75) Inventors: Stuart A. Berke, Austin, TX (US); Kunrong Wang, Austin, TX (US)

(73) Assignee: Dell Products, LP, Round Rock, TX (US)

( * ) Notice: Subject to any disclaimer, the term of this patent is extended or adjusted under 35 U.S.C. 154(b) by 633 days.

(21) Appl. No.: 12/362,158

(22) Filed: Jan. 29, 2009

(65) Prior Publication Data

US 2010/0191991 A1 Jul. 29, 2010

(51) Int. Cl.
*G06F 11/30* (2006.01)

(52) U.S. Cl. ........................................ 713/340; 713/321

(58) Field of Classification Search ........... 713/300–340
See application file for complete search history.

(56) References Cited

U.S. PATENT DOCUMENTS

| | | | |
|---|---|---|---|
| 5,917,312 A | 6/1999 | Brkovic | |
| 6,425,086 B1 * | 7/2002 | Clark et al. | 713/322 |
| 6,472,856 B2 | 10/2002 | Groom et al. | |
| 6,496,729 B2 * | 12/2002 | Thompson | 607/2 |
| 6,601,179 B1 * | 7/2003 | Jackson et al. | 713/322 |
| 6,928,561 B2 | 8/2005 | Farkas et al. | |
| 7,080,268 B2 | 7/2006 | Mosley | |
| 7,098,637 B2 | 8/2006 | Jauregui et al. | |
| 7,317,306 B2 | 1/2008 | Fite | |
| 7,319,312 B2 | 1/2008 | Leung et al. | |
| 7,577,859 B2 * | 8/2009 | Bilak | 713/320 |
| 7,741,736 B2 * | 6/2010 | Clemo et al. | 307/130 |
| 2004/0186837 A1 | 9/2004 | Lambert et al. | |
| 2006/0294437 A1 * | 12/2006 | Washburn et al. | 714/42 |
| 2008/0040563 A1 * | 2/2008 | Brittain et al. | 711/154 |
| 2010/0115179 A1 * | 5/2010 | Carr et al. | 711/103 |
| 2010/0138684 A1 * | 6/2010 | Kim et al. | 713/601 |

* cited by examiner

*Primary Examiner* — Raymond Phan
(74) *Attorney, Agent, or Firm* — Larson Newman, LLP

(57) ABSTRACT

A system includes a dual in-line memory module and a system board. The dual in-line memory module includes a plurality of dynamic random access memory devices, and a system management interface. The system management interface is configured to measure a first voltage provided to the dynamic random access memory devices, and configured to digitize the first voltage. The system board includes a test module and a voltage regulator. The test module is configured to receive the digitized first voltage via a connector pin between the dual in-line memory module and the system board, and configured to compare the first voltage to a first threshold voltage. The voltage regulator is configured to adjust a remote sense target voltage for the system management interface when the first voltage is less than the first threshold voltage.

19 Claims, 7 Drawing Sheets

SYSTEM AND METHOD FOR USING AN ON-DIMM REMOTE SENSE FOR CREATING PERFORMANCE AND POWER OPTIMIZATION

FIELD OF THE INVENTION

This disclosure generally relates to information systems, and more particularly relates to a system and method for using an on-Dual In-line Memory Module remote sense for performance and power optimization.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements can vary between different applications, information handling systems can also vary regarding what information is handled, how the information is handled, how much information is processed, stored, or communicated, and how quickly and efficiently the information can be processed, stored, or communicated. The variations in information handling systems allow for information handling systems to be general or configured for a specific user or specific use such as financial transaction processing, airline reservations, enterprise data storage, or global communications. In addition, information handling systems can include a variety of hardware and software components that can be configured to process, store, and communicate information and can include one or more computer systems, data storage systems, and networking systems.

The range of memory capacity, bandwidth, and thus power supported by servers has been growing steadily due to an increasing number of memory channels per central processing unit, an increasing number of ranks per channel, and the advent of buffered dual in-line memory modules (DIMM) solutions that can support more physical ranks than the number of logical ranks seen by the memory controller.

The wide range of memory power requirements due to system configuration and operation can require memory voltage regulators (VRs) to operate at a high efficiency across different configurations and workloads. While the memory power per VR has been growing each generation, the voltage and tolerance range of the voltage to be delivered at the dual random access memories (DRAMs) and register/phase locked loops (PLLs) in a DIMM has been shrinking. VR remote-sensing, where the VR dynamically adjust the output voltage as seen at a point near the middle of the DIMMs on the system board, can be used to compensate for internal resistance (IR) drops seen in the system boards, DIMM connectors, and DIMM modules.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other teachings can certainly be utilized in this application.

Figure 1:
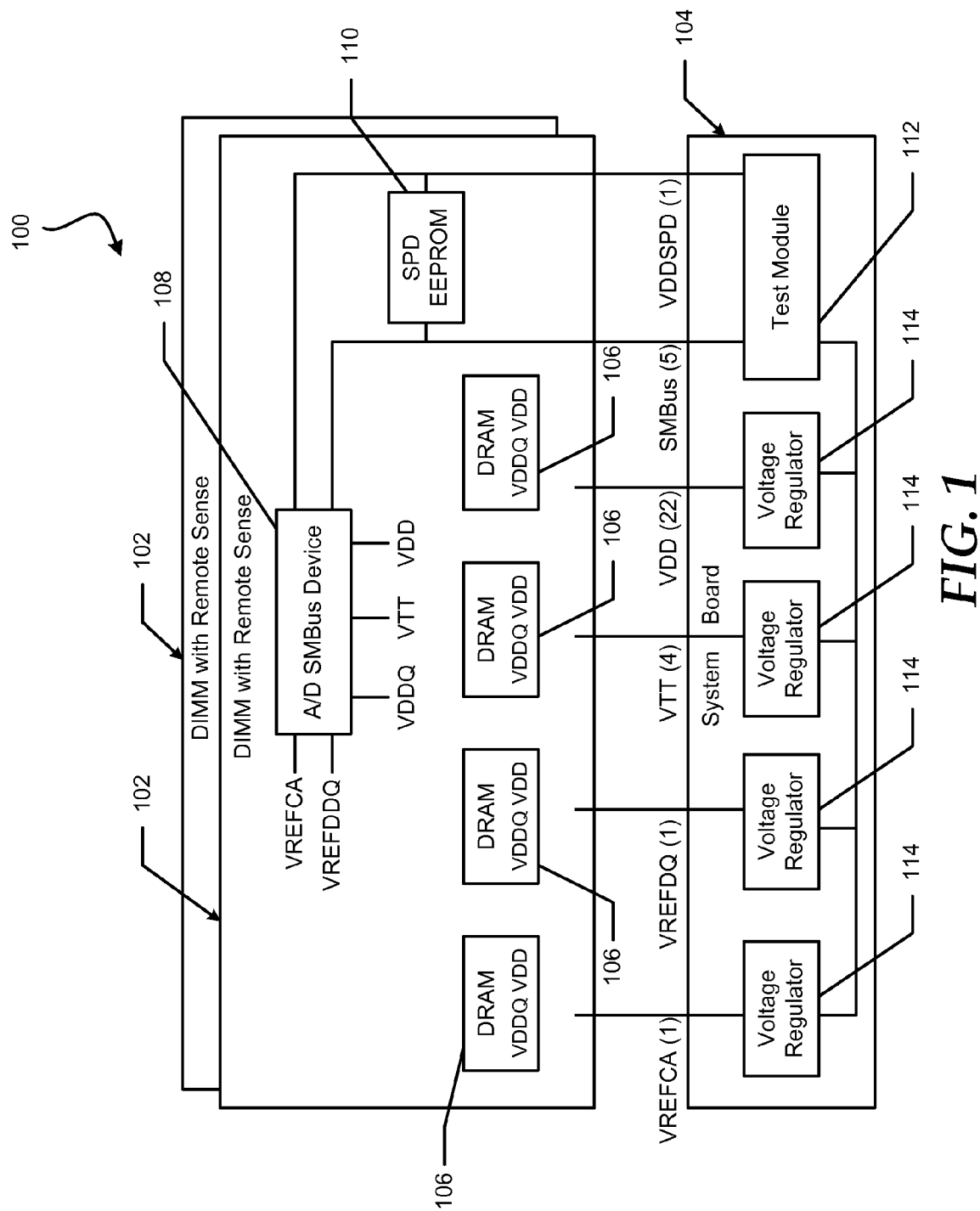
FIG. 1 is a block diagram of an information handling system.

FIG. 1 shows an information handling system 100. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network server or storage device, a switch router or other network communication device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communications between the various hardware components.

The information handling system 100 includes a plurality of DIMMs 102, and a system board 104. Each of the DIMMs 102 include a plurality of DRAMs 106, a system management interface such as a system management bus device with analog to digital conversion capability (A/D SMBus) 108, and a serial presence detect electrically erasable programmable read only memory (SPD EEPROM) 110. The system board 104 includes a test module 112, and a plurality of VRs 114. The DIMM 102 and the system board 104 are in communication through a plurality of connector pins, which can include one $V_{REFCA}$ connector pin, one $V_{REFDQ}$ connector pin, four $V_{TT}$ connector pins, twenty-two $V_{DD}$ connector pins, five SMBus connector pins, and one $V_{DDSPD}$ connector pin. For simplicity, each set of connector pins is shown as a single connection. The A/D SMBus 108 is in communication with the SPD EEPROM 110, and with the test module 112 via the SMBus connection and the $V_{DDSPD}$ connection. The test module 112 is in communication with the VRs 114, which are in turn in communication with the DIMM 102.

Upon the information handling system 100 being powered on, a power-on self-test (POST) can be performed for the information handling system by the A/D SMBus 108, the SPD EEPROM 110, and the test module 112. During the POST, the A/D SMBus 108 can measure the power supply voltage, labeled VDD voltage, and the terminating voltage, labeled VTT voltage, on the DIMM 102. The A/D SMBus 108 can also measure the voltage reference for the command address, labeled VREFCA voltage, the voltage reference for the supply voltage of the input/output interface, labeled VREFDDQ voltage, and/or the supply voltage for the input/output interface, labeled VDDQ voltage on the DIMM 102. The VDDQ voltage can be converted from the VDD voltage by an internal voltage regulator (not shown) of the DIMM 102 to provide the necessary voltage to the devices requiring the VDDQ voltage. The A/D SMBus 108 can remote-sense these voltages at the DRAMs 106, a register/PLL, termination resistors, and other devices as applicable. Remote-sensing is performed by the A/D SMBus 108 measuring voltage at different points on the DIMM 102 away from the A/D SMBus. Once the voltages are measured, an A/D converter of the A/D SMBus 108 can digitize and store the voltages. In another embodiment, the A/D converter can be integrated into the SPD EEPROM 110, such that the SPD EEPROM can measure and digitize the remote-sense voltages. The digitized voltages can then be provided from the A/D SMBus 108 to the test module 112 via one of the SMBus connectors.

Based on the voltages received from the A/D SMBus 108, the test module 112 can determine an output voltage range requirement for the DIMM 102. The test module 112 can then set each of the VRs 114 to have a target regulated output voltage based on the voltage requirement obtained for the DIMM 102 during the POST. The test module 112 can also create idle and stressed operations for the DIMM 102. For example, the test module 112 can create the idle operation by allowing the DIMM 102 to operate at a lowest operating level, and the test module can create the stressed operation by causing the DIMM to operate at a maximum operating level. The test module 112 can then receive voltage measurements for the DIMM 102 from the A/D SMBus 108 for both the idle and stressed operations. The voltage measurements can be used to further determine the voltage requirements for each of the DIMMs. Thus, the test module 112 can use these measurements to refine the target regulated output voltages for the VRs 114.

The test module 112 can receive the voltage measurements and can calculate the voltage range requirements for each of the DIMMs 102. Thus, the VRs 114 associated with each DIMM 102 can be adjusted based on the voltage requirement of the associated DIMM. The test module 112 can also use the calculated power requirement for the DIMM 102 to cause the VRs 114 to boost the voltages provided to the DRAMs 106. The boost in the voltages can increase an operation margin of the DRAMs 106, can increase an associated performance of the DRAMs, and/or can be used for overclocking of the DIMM 102. The test module 112 can be implemented in hardware, software, and/or any combination of hardware and software.

Figure 2:
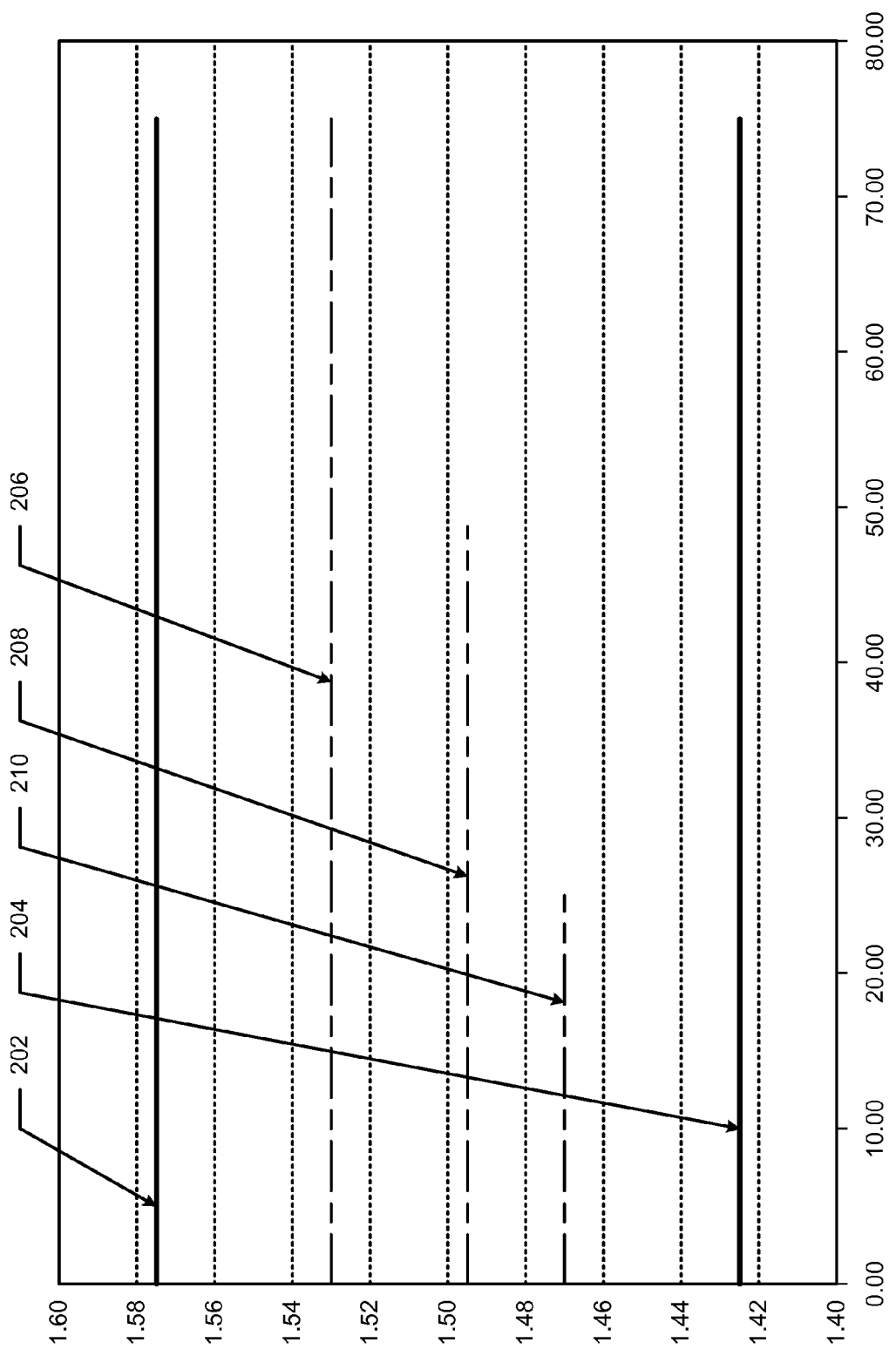
FIG. 2 is a plurality of line graphs representing regulated output voltages for a dual in-line memory module of the information handling system.

FIG. 2 shows a plurality of line graphs representing regulated output voltages of the VRs 114. The regulated output voltages include a maximum voltage 202, a minimum voltage 204, an initial regulated output voltage 206, a moderate regulated output voltage 208, and a light regulated output voltage 210. The regulated output voltage of the VR 114 can be originally set to the initial regulated output voltage 206, so that the DIMM 102 can be provided with a voltage between the maximum voltage 202 and the minimum voltage for all loads applied to the DIMM. If the test module 112 determines that the DIMM 102 has a moderate load, the test module can lower the target output voltage for the VRs 114 from the initial regulated voltage output target 206 to the moderate regulated voltage output 208. If the test module 112 determines that the DIMM 102 has a light load, the test module can reduce the target output voltage for the VRs 114 to the light regulated output voltage 210.

Figure 3:
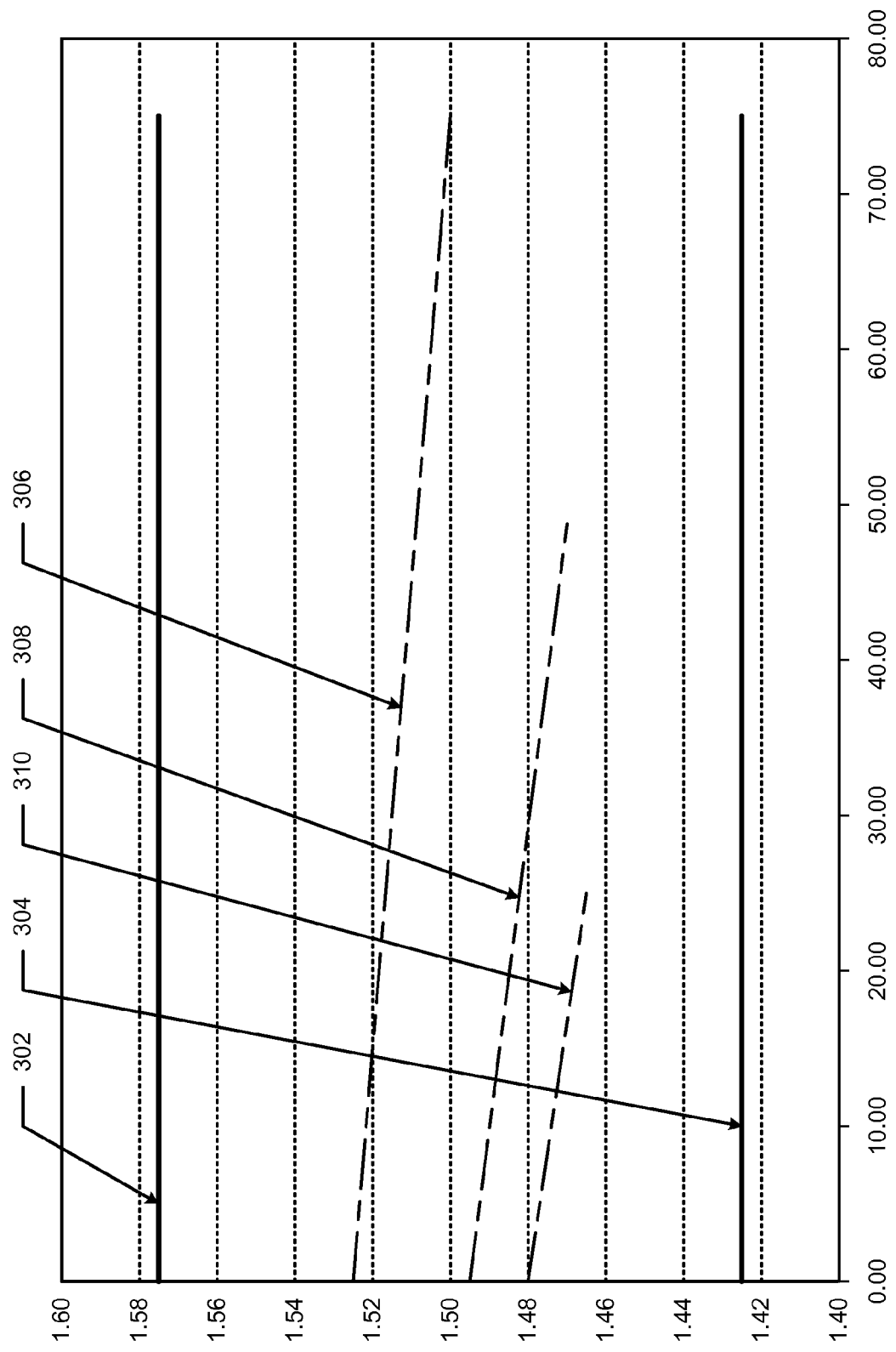
FIG. 3 is another plurality of line graphs representing regulated output voltages for the dual in-line memory module.

FIG. 3 shows a plurality of line graphs representing regulated output voltages of the VRs 114. The regulated output voltages include a maximum voltage 302, a minimum voltage 304, an initial regulated output voltage 306, a moderate regulated output voltage 308, and a light regulated output voltage 310. The regulated output voltage of the VR 114 can be originally set to the initial regulated output voltage 306, so that the DIMM 102 can be provided with a voltage between the maximum voltage 302 and the minimum voltage for all loads applied to the DIMM. The set points for initial regulated output voltage 306 can be dynamically adjusted based on the load line of the DIMM. If the test module 112 determines that the DIMM 102 has a moderate load, the test module can lower the target output voltage for the VRs 114 from the initial regulated voltage output target 306 to the moderate regulated voltage output 308. The set points for moderate regulated output voltage 308 also can be dynamically adjusted based on the load line of the DIMM. If the test module 112 determines that the DIMM 102 has a light load, the test module can reduce the target output voltage for the VRs 114 to the light regulated output voltage 310. The set points for light regulated output voltage 306 also can be dynamically adjusted based on the load line of the DIMM.

Figure 4:
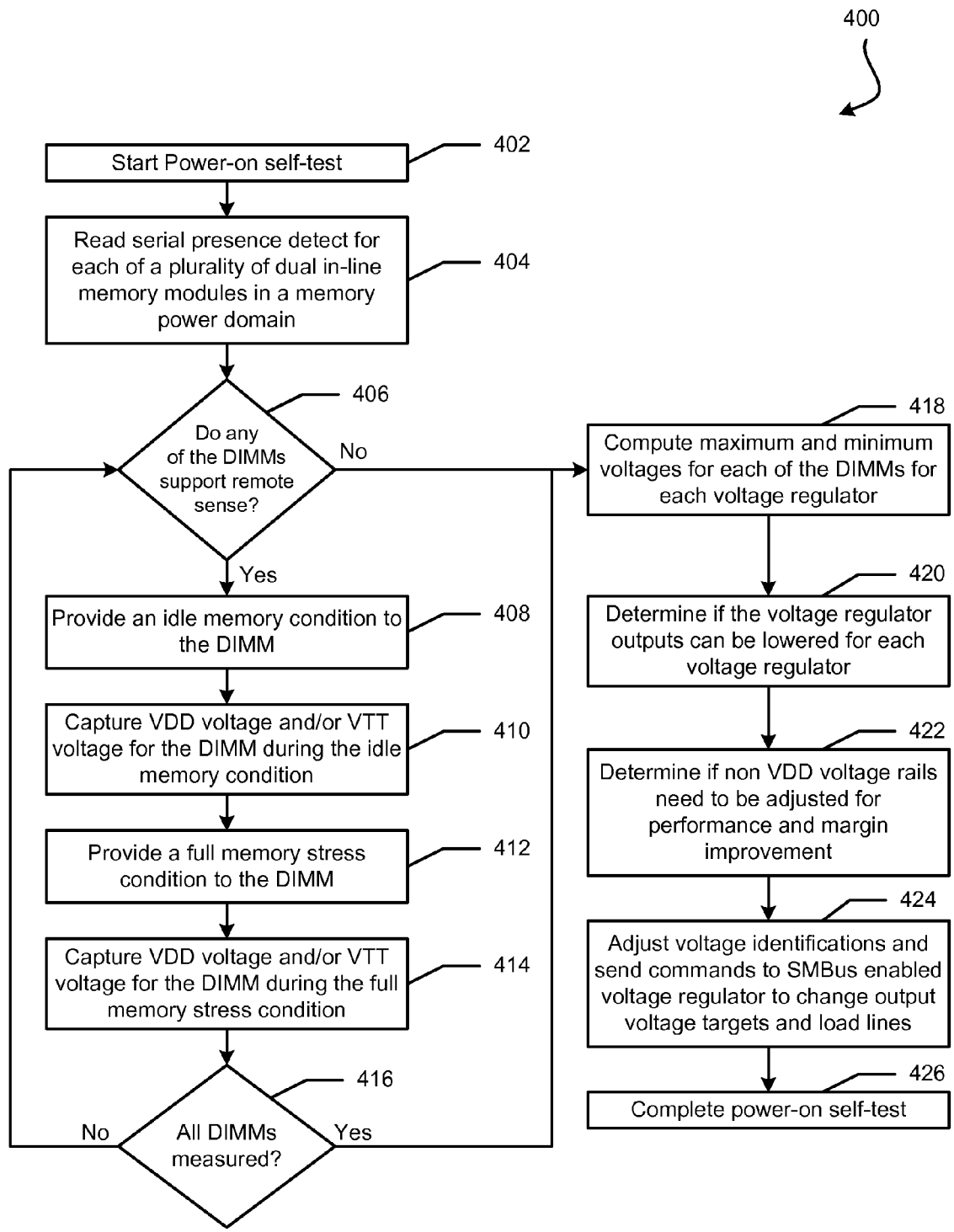
FIG. 4 is a flow diagram of a method for optimizing power and performance of a DIMM.

FIG. 4 shows a flow diagram of a method 400 for optimizing power and performance of a DIMM. At block 402, a power-on self-test (POST) is started for a system. A serial presence detect is read for each of a plurality of DIMMs in a memory power domain of the system at block 404. At block 406, a determination is made whether one of the DIMMs supports remote-sense. If the DIMM supports remote-sense, an idle memory condition is provided to the DIMM at block 408. At block 410, the VDD voltage and the VTT voltage are captured for the DIMM during the idle memory condition. A full memory stress condition is provided to the DIMM at block 412. At block 414, the VDD voltage and the VTT voltage are captured for the DIMM during the full memory stress condition. At block 416, a determination is made whether all of the DIMMs have been measured. If all of the DIMMs have not been measured, then the flow continues as stated above at block 406.

If all of the DIMMs have been measured, a maximum voltage and a minimum voltage for each of the DIMMs are computed for each voltage regulator at block 418. At block 420, it is determined if the voltage regulator outputs can be lowered for each voltage regulator. It is determined whether non VDD voltage rails need to be adjusted for performance and margin improvement at block 422. At block 424, voltage identifications are adjusted and commands are sent to a SMBus enabled voltage regulators to change the output voltage targets and load lines. At block 426, the POST is completed.

Figure 5:
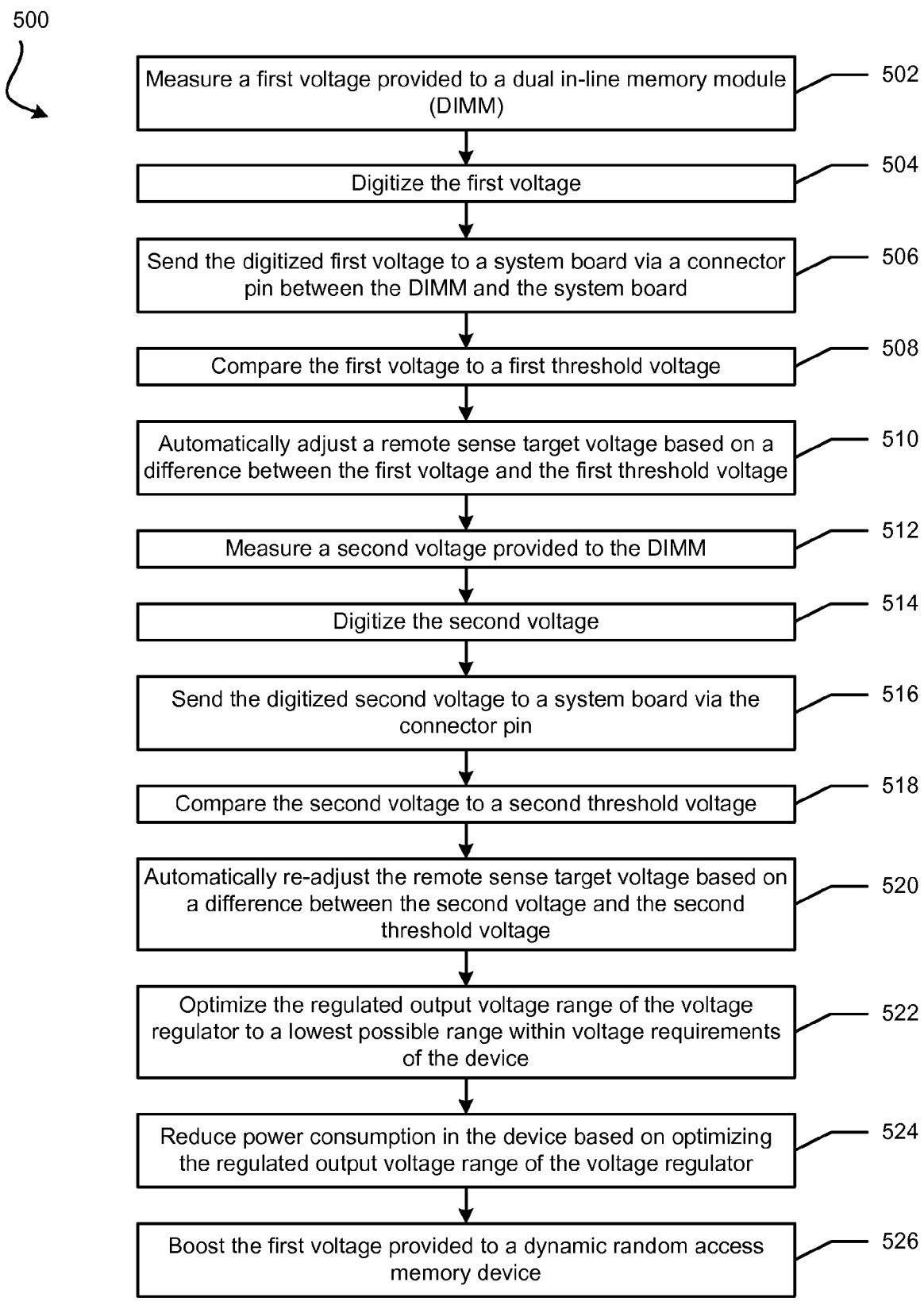
FIG. 5 is a flow diagram of an alternative method for optimizing power and performance of a DIMM.

FIG. 5 shows a flow diagram of an alternative method 500 for optimizing power and performance of a DIMM. At block 502, a first voltage provided to the DIMM is measured. The first voltage is digitized at block 504. At block 506, the digitized first voltage is sent to a system board via a connector pin between the DIMM and the system board. The first voltage is compared to a first threshold voltage at block 508. At block 510, a remote-sense target voltage is automatically adjusted based on a difference between the first voltage and the first threshold voltage.

At block 512, a second voltage provided to the DIMM is measured. The second voltage is digitized at block 514. At block 516, the digitized second voltage is sent to the system board via the connector pin. The second voltage is compared to a second threshold voltage at block 518. At block 520, the remote-sense target voltage is automatically re-adjusted based on a difference between the second voltage and the second threshold voltage. The regulated output voltage range of the voltage regulator is optimized to a lowest possible range within the voltage requirements of the device at block 522. At block 524, power consumption is reduced in the device based on optimizing the regulated output voltage range of the voltage regulator. The first voltage provided to a DRAM device is boosted at block 526. The first voltage can be boosted to improve the margin and/or the performance of the DIMM.

Figure 6:
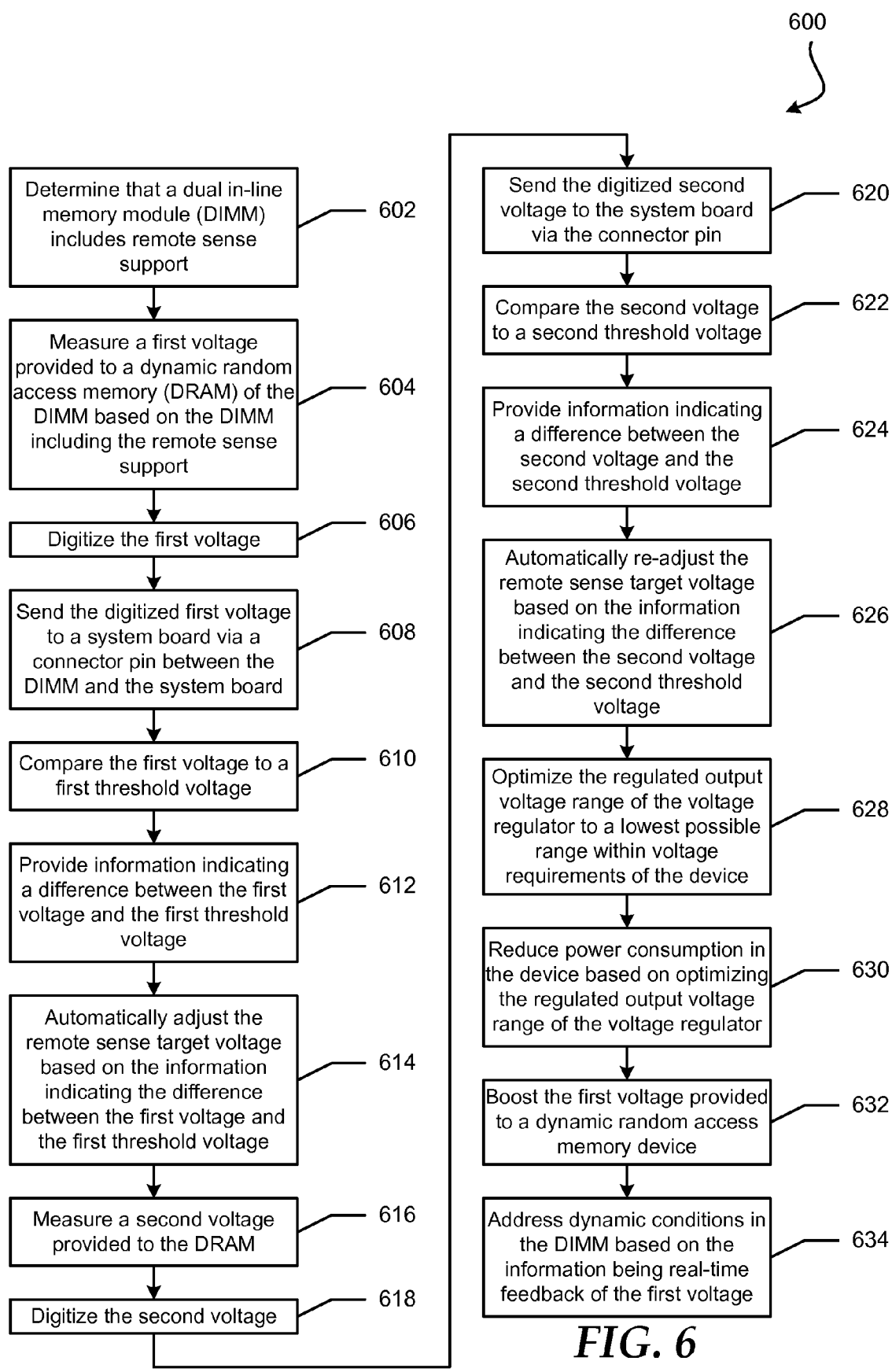
FIG. 6 is a flow diagram of another alternative method for optimizing power and performance of a DIMM.

FIG. 6 shows a flow diagram of an alternative method 600 for optimizing power and performance of a DIMM. At block 602, it is determined whether the DIMM includes remote-sense support. If so, a first voltage provided to a DRAM of the DIMM is measured based on the DIMM including the remote-sense support at block 604. At block 606, the first voltage is digitized. The digitized first voltage is sent to a system board via a connector between the DIMM and the system board at block 608. At block 610, the first voltage is compared to a first threshold voltage. Information indicating a difference between the first voltage and the first threshold voltage is provided at block 612. At block 614, the remote-sense target voltage is automatically adjusted based on the information indicating the difference between the first voltage and the first threshold voltage.

A second voltage provided to the DRAM is measured at block 616. At block 618, the second voltage is digitized. The digitized second voltage is sent to the system board via the connector pin at block 620. At block 622, the second voltage is compared to a second threshold voltage. Information indicating a difference between the second voltage and the second threshold voltage is provided at block 624. At block 626, the remote-sense target voltage is automatically re-adjusted based on the information indicating the difference between the second voltage and the second threshold voltage.

The regulated output voltage range of the voltage regulator is optimized to a lowest possible range within the voltage requirements of the device at block 628. At block 630, power consumption in the device is reduced based on optimizing the regulated output voltage range of the voltage regulator. The first voltage provided to a DRAM is boosted at block 632. At block 634, dynamic conditions in the DIMM are addressed based on the information being real-time feedback of the first voltage. The dynamic conditions can be addressed based on the system management interface having the capability to make real-time voltage measurements and provide the measurements to the test module.

Figure 7:
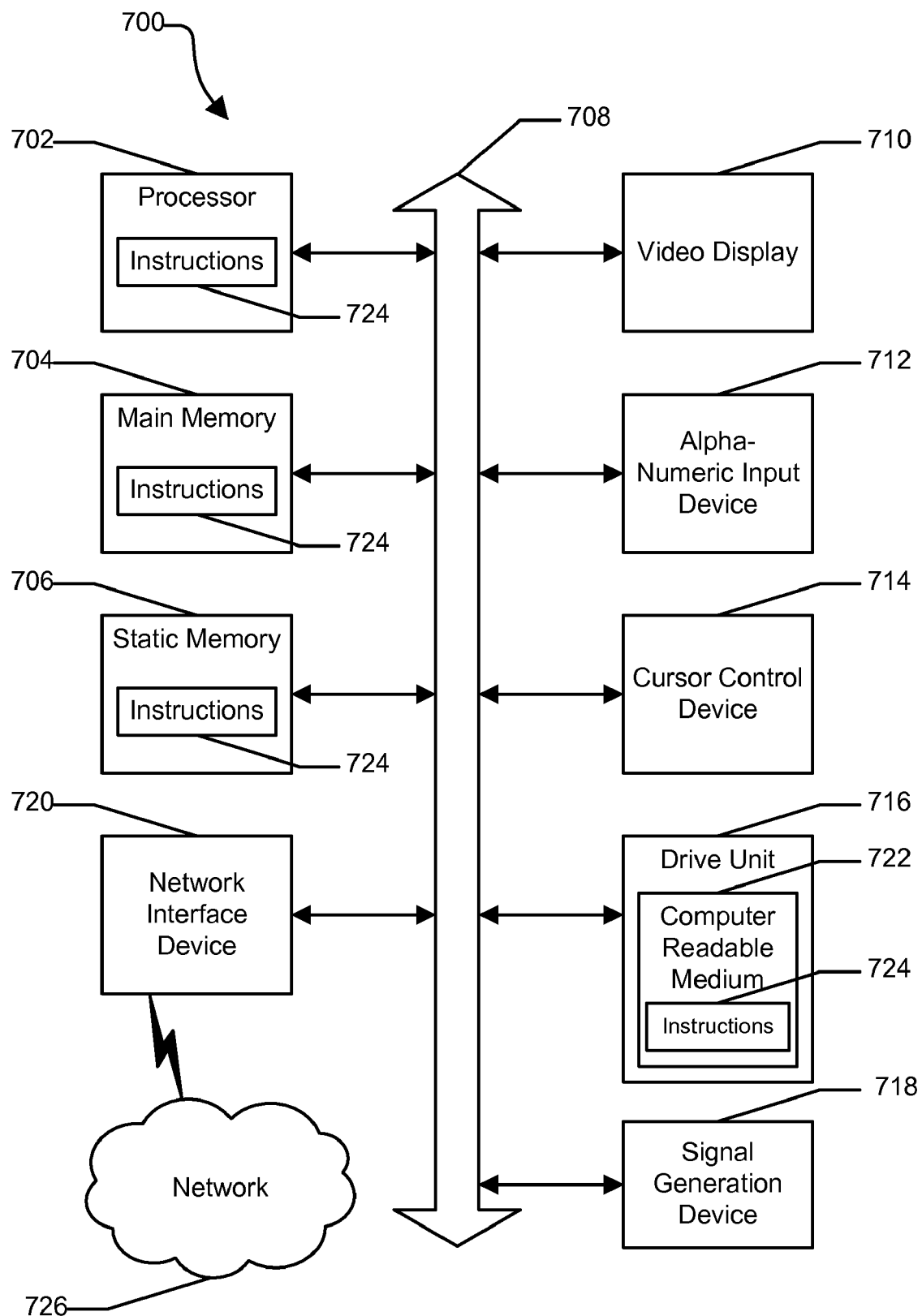
FIG. 7 is a block diagram of a general computer system.

FIG. 7 shows an illustrative embodiment of a general computer system 700 in accordance with at least one embodiment of the present disclosure. The computer system 700 can include a set of instructions that can be executed to cause the computer system to perform any one or more of the methods or computer based functions disclosed herein. The computer system 700 may operate as a standalone device or may be connected, e.g., using a network, to other computer systems or peripheral devices.

In a networked deployment, the computer system may operate in the capacity of a server or as a client user computer in a server-client user network environment, or as a peer computer system in a peer-to-peer (or distributed) network environment. The computer system 700 can also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular embodiment, the computer system 700 can be implemented using electronic devices that provide voice, video or data communication. Further, while a single computer system 700 is illustrated, the term "system" shall also be taken to include any collection of systems or sub-systems that individually or jointly execute a set, or multiple sets, of instructions to perform one or more computer functions.

The computer system 700 may include a processor 702, e.g., a central processing unit (CPU), a graphics processing unit (GPU), or both. Moreover, the computer system 700 can include a main memory 704 and a static memory 706 that can communicate with each other via a bus 708. As shown, the computer system 700 may further include a video display unit 710, such as a liquid crystal display (LCD), an organic light emitting diode (OLED), a flat panel display, a solid state display, or a cathode ray tube (CRT). Additionally, the computer system 700 may include an input device 712, such as a keyboard, and a cursor control device 714, such as a mouse. The computer system 700 can also include a disk drive unit 716, a signal generation device 718, such as a speaker or remote control, and a network interface device 720.

In a particular embodiment, as depicted in FIG. 7, the disk drive unit 716 may include a computer-readable medium 722 in which one or more sets of instructions 724, e.g. software, can be embedded. Further, the instructions 724 may embody one or more of the methods or logic as described herein. In a particular embodiment, the instructions 724 may reside completely, or at least partially, within the main memory 704, the static memory 706, and/or within the processor 702 during execution by the computer system 700. The main memory 704 and the processor 702 also may include computer-readable media. The network interface device 720 can provide connectivity to a network 726, e.g., a wide area network (WAN), a local area network (LAN), or other network.

In an alternative embodiment, dedicated hardware implementations such as application specific integrated circuits, programmable logic arrays and other hardware devices can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

In accordance with various embodiments of the present disclosure, the methods described herein may be implemented by software programs executable by a computer system. Further, in an exemplary, non-limited embodiment, implementations can include distributed processing, component/object distributed processing, and parallel processing.

Alternatively, virtual computer system processing can be constructed to implement one or more of the methods or functionality as described herein.

The present disclosure contemplates a computer-readable medium that includes instructions 724 or receives and executes instructions 724 responsive to a propagated signal, so that a device connected to a network 726 can communicate voice, video or data over the network 726. Further, the instructions 724 may be transmitted or received over the network 726 via the network interface device 720.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to capture carrier wave signals such as a signal communicated over a transmission medium. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

Although only a few exemplary embodiments have been described in detail above, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A system comprising:
    a dual in-line memory module including:
        a plurality of dynamic random access memory devices; and
        a system management interface configured to measure a first voltage provided to the dynamic random access memory devices, to measure a power supply voltage and a terminating voltage provided during a stressed operation of the dynamic random access memory devices, and configured to digitize the first voltage, the power supply voltage, and the terminating voltage; and
    a system board including:
        a test module configured to receive the digitized first voltage, the digitized power supply voltage, and the digitized terminating voltage via a connector pin between the dual in-line memory module and the system board, and configured to compare the first voltage to a first threshold voltage; and
        a voltage regulator configured to adjust a remote sense target voltage for the system management interface based on the digitized power supply voltage and the digitized terminating voltage when the first voltage is less than the first threshold voltage.

2. The system of claim 1 wherein the system management interface is further configured to measure a second voltage provided to the dynamic random access memory devices, and configured to digitize the second voltage.

3. The system of claim 1 wherein the voltage regulator is further configured to optimize the regulated output voltage range of the voltage regulator to a lowest possible range within voltage requirements of the dynamic random access memory devices, and configured to reduce power consumption in the dynamic random access memory devices based on optimizing the regulated output voltage range of the voltage regulator.

4. The system of claim 1 wherein the voltage regulator is further configured to boost the first voltage provided to the dynamic random access memory devices.

5. The system of claim 1 wherein the connector pin is selected from a group consisting of a system management bus pin, a serial presence detect pin, and a custom remote sense pin.

6. The system of claim 1 wherein the system management interface is a system management bus device containing analog to digital conversion capability.

7. The system of claim 2 wherein the test module is further configured to receive the digitized second voltage to the system board via the connector pin, and to compare the second voltage to a second threshold voltage.

8. The system of claim 7 wherein the voltage regulator is further configured to re-adjust the remote sense target voltage based on a difference between the second voltage and the second threshold voltage.

9. A non-transitory computer readable medium comprising a plurality of instructions to manipulate a processor, the plurality of instructions comprising:
    instructions to measure a first voltage provided to a dual in-line memory module;
    instructions to digitize the first voltage;
    instructions to send the digitized first voltage to a system board via a connector pin between the dual in-line memory module and the system board;
    instructions to compare the first voltage to a first threshold voltage; and
    instructions to adjust a remote sense target voltage to overclock the dual in-line memory module based on a difference between the first voltage and the first threshold voltage.

10. The non-transitory computer readable medium of claim 9 further comprising:
    instructions to measure a second voltage provided to the dual in-line memory module;
    instructions to digitize the second voltage;
    instructions to send the digitized second voltage to the system board via the connector pin between the dual in-line memory module and the system board;
    instructions to compare the second voltage to a second threshold voltage; and
    instructions to re-adjust the remote sense target voltage based on a difference between the second voltage and the second threshold voltage.

11. The non-transitory computer readable medium of claim 9 further comprising:

instructions to optimize the regulated output voltage range of the voltage regulator to a lowest possible range within voltage requirements of the device; and instructions to reduce power consumption in the device based on optimizing the regulated output voltage range of the voltage regulator.

12. The non-transitory computer readable medium of claim 9 further comprising:

instructions to boost the first voltage provided to the dynamic random access memory device.

13. The non-transitory computer readable medium of claim 9 wherein the first voltage is a supply voltage provided to a dynamic random access memory.

14. The non-transitory computer readable medium of claim 9 wherein the connector pin is selected from a group consisting of a system management bus pin, a serial presence detect pin, and a custom remote sense pin.

15. A non-transitory computer readable medium comprising a plurality of instructions to manipulate a processor, the plurality of instructions comprising:

instructions to determine that a dual in-line memory module includes remote sense support;

instructions to measure a first voltage provided to a dynamic random access memory of the dual in-line memory module based on the dual in-line memory module including the remote sense support;

instructions to digitize the first voltage;

instructions to send the digitized first voltage to a system board via a connector pin between the dual in-line memory module and the system board;

instructions to compare the first voltage to a first threshold voltage;

instructions to determine a speed of the connector pin;

instructions to provide information indicating a difference between the first voltage and the first threshold voltage;

instructions to automatically adjust a remote sense target voltage based on the information indicating the difference between the first voltage and the first threshold voltage; and instructions to address dynamic conditions in the dual in-line memory module based on the information being real-time feedback of the first voltage, wherein the real-time feedback is based on the speed of the connector pin.

16. The non-transitory computer readable medium of claim 15 further comprising:

instructions to measure a second voltage provided to the dual in-line memory module;

instructions to digitize the second voltage;

instructions to send the digitized second voltage to the system board via the connector pin between the dual in-line memory module and the system board;

instructions to compare the second voltage to a second threshold voltage; and instructions to re-adjust the remote sense target voltage based on a difference between the second voltage and the second threshold voltage.

17. The non-transitory computer readable medium of claim 15 further comprising:

instructions to optimize the regulated output voltage range of the voltage regulator to a lowest possible range within voltage requirements of the device; and instructions to reduce power consumption in the device based on optimizing the regulated output voltage range of the voltage regulator.

18. The non-transitory computer readable medium of claim 15 further comprising:

instructions to boost the first voltage provided to the dynamic random access memory device.

19. The non-transitory computer readable medium of claim 15 wherein the connector pin is selected from a group consisting of a system management bus pin, a serial presence detect pin, and a custom remote sense pin.

\* \* \* \* \*